US012217788B2

(12) United States Patent
Wieduwilt et al.

(10) Patent No.: US 12,217,788 B2
(45) Date of Patent: Feb. 4, 2025

(54) APPARATUSES AND METHODS FOR CONTROLLING SENSE AMPLIFIER OPERATION

(71) Applicant: MICRON TECHNOLOGY, INC., Boise, ID (US)

(72) Inventors: Christopher G. Wieduwilt, Boise, ID (US); John P. Behrend, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 210 days.

(21) Appl. No.: 17/841,517

(22) Filed: Jun. 15, 2022

(65) Prior Publication Data

US 2023/0410885 A1  Dec. 21, 2023

(51) Int. Cl.
*G11C 11/4091* (2006.01)
*G11C 11/4074* (2006.01)
*G11C 11/4093* (2006.01)

(52) U.S. Cl.
CPC ...... *G11C 11/4091* (2013.01); *G11C 11/4074* (2013.01); *G11C 11/4093* (2013.01)

(58) Field of Classification Search
CPC .................................................. G11C 11/4091
USPC ...................................................... 365/230.03
See application file for complete search history.

(56) References Cited

U.S. PATENT DOCUMENTS 10,839,873 B1 * 11/2020 Lee ...................... G11C 7/1048
10,943,644 B1 *  3/2021 Lee ...................... G11C 11/4091

* cited by examiner

*Primary Examiner* — Anthan Tran
(74) *Attorney, Agent, or Firm* — Dorsey & Whitney LLP

(57) ABSTRACT

Apparatuses and methods for controlling sense amplifier operation are described. An example method includes providing a control signal having a first high logic level voltage to activate isolation switches of a sense amplifier. The control signal transitions from the first high logic level voltage to an inactive voltage to deactivate the isolation switches of the sense amplifier before accessing a memory cell. The control signal is provided having the first high logic level voltage to activate the isolation switches of the sense amplifier after accessing the memory cell. The control signal is increased from the first high logic level voltage to a second high logic level voltage.

12 Claims, 5 Drawing Sheets

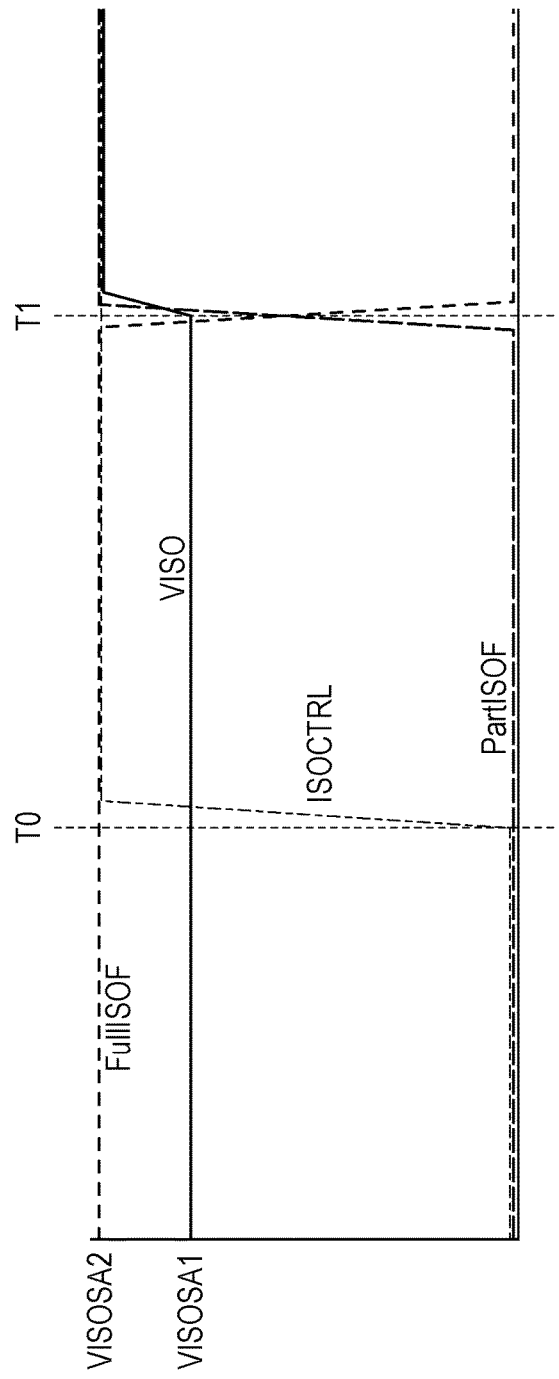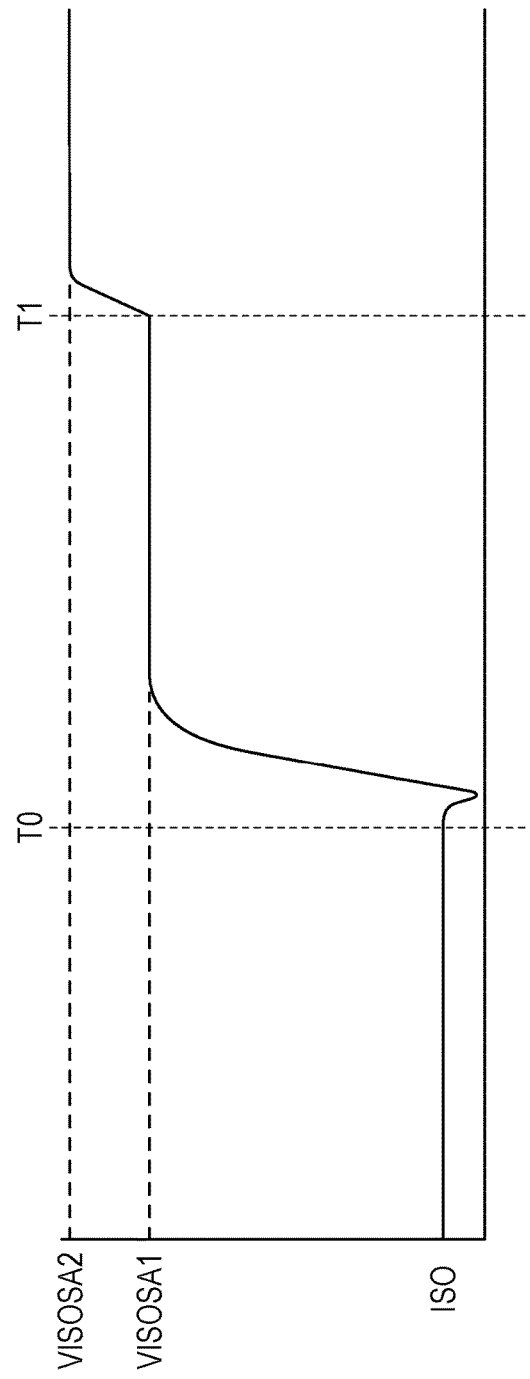

APPARATUSES AND METHODS FOR CONTROLLING SENSE AMPLIFIER OPERATION

BACKGROUND

Memory devices include one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line.

The change in voltage on the digit line may be sensed and amplified by a sense amplifier to indicate the value of the data state stored in the memory cell. Conventional sense amplifiers are typically coupled to a pair of complementary digit lines to which a large number of memory cells are coupled. When memory cells are accessed, a row of memory cells are activated. The activated memory cells cause the voltage of one of the digit lines of a pair to increase or decrease slightly, depending on whether the memory cell coupled to the digit line is charged or not, resulting in a small voltage difference (e.g., less than 100 mV) between the digit lines. The sense amplifiers perform sense amplifier operations to sense the voltage difference between the digit lines and amplify a corresponding data state for the activated memory cells.

It may be difficult to accurately sense and amplify the small voltage difference in some circumstances. For example, circuit imbalances and voltage noise reduce sense margin, which may result in the sense amplifiers erroneously sensing the voltage difference and amplifying incorrect data. To address the reduction in sense margin, the sense amplifier operation may be extended to provide greater signal stability during the sensing and amplification of the digit line voltage difference. However, extending the time of the sense amplifier operation may reduce access speed, which is generally undesirable.

BRIEF DESCRIPTION OF THE DRAWINGS

FIG. 3A is a signal diagram of a high logic level voltage provided by a voltage control circuit and various control signals according to an embodiment of the disclosure.

FIG. 3B is a signal diagram of a control signal provided by and enabled control signal driver circuit according to an embodiment of the disclosure.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
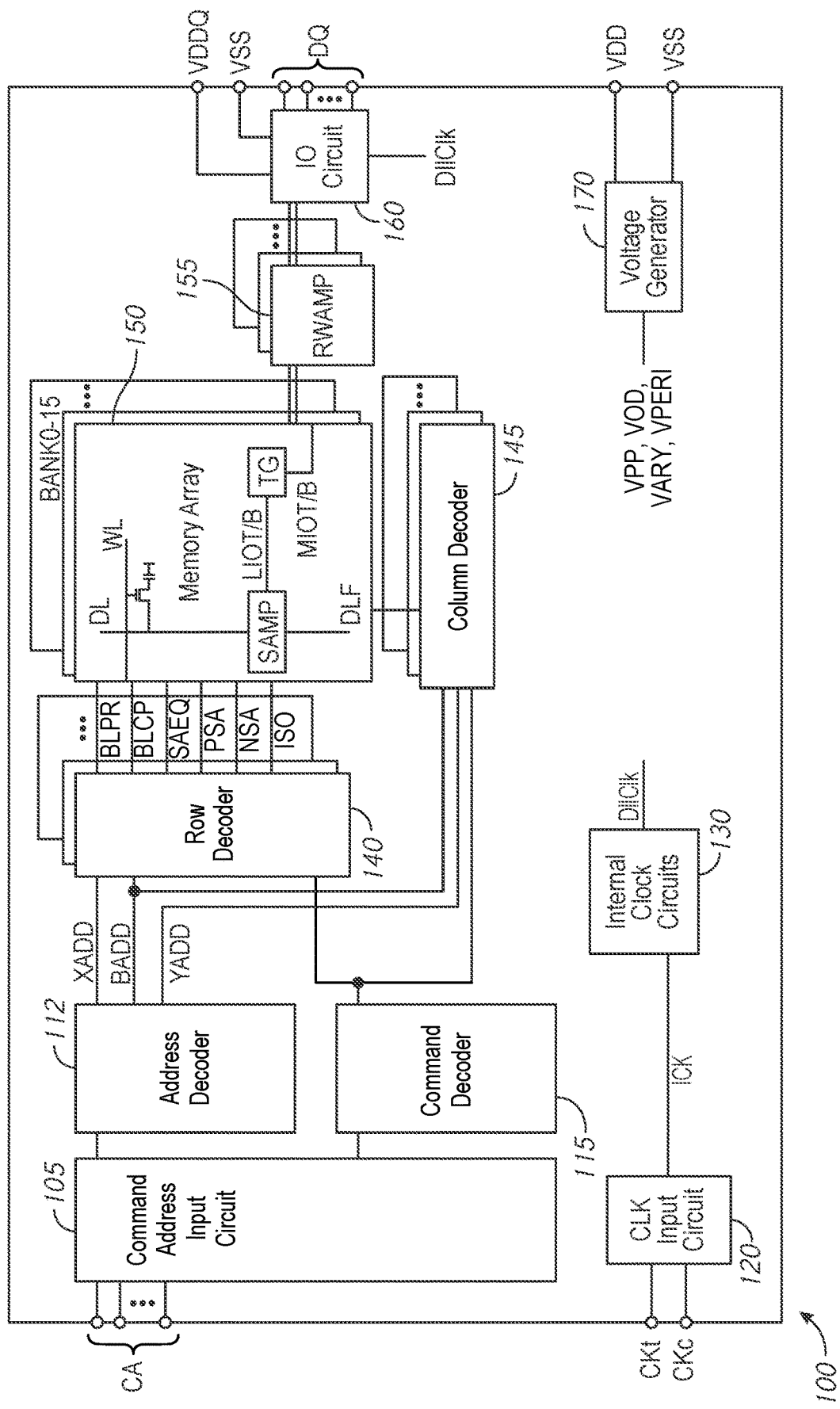
FIG. 1 is a block diagram of a semiconductor device according to an embodiment of the invention.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example.

The semiconductor device 100 includes a memory array 150. The memory array 150 includes a plurality of banks, each bank including a plurality of word lines WL, a plurality of bit lines DL, and a plurality of memory cells MC arranged at intersections of the plurality of word lines WL and the plurality of bit lines DL. The selection of the word line WL is performed by a row decoder 140 and the selection of the bit line DL is performed by a column decoder 145. Sense amplifiers (SAMP) are coupled to corresponding bit lines DL and DLF. The sense amplifiers are further coupled to at least one respective local I/O line pair (LIOT/B), which is in turn coupled to at least respective one main I/O line pair (MIOT/B), via transfer gates (TG). The row decoder 140 provides various control signals to circuits of the memory array 150 to perform memory operations. For example, the row decoder 140 provides control signals related to an access operation, such as, sense line precharge control signal BLPR, compensation control signal BLCP, precharge control signal SAEQ, control signals PSA and NSA, and control signal ISO, which will be described in more detail below.

The semiconductor device 100 may employ a plurality of external terminals that include command and address terminals coupled to command/address bus to receive command/address signals CA, clock terminals to receive clock signals CKt and CKc, data terminals DQ, power supply terminals VDD, VSS, and VDDQ.

The command/address terminals may be supplied with address signals and a bank address signal from outside. The address signals and the bank address signals supplied to the address terminals are transferred, via the command/address input circuit 105, to an address decoder 112. The address decoder 112 receives the address signals and supplies decoded row address signals XADD to the row decoder 140, and decoded column address signals YADD to the column decoder 145. The address decoder 112 also receives the bank address signals and supplies decoded bank address signals BADD to the row decoder 140, the column decoder 145.

The command/address terminals may further be supplied with command signals from outside, such as, for example, a memory controller. The command signals may be transferred, via the command/address input circuit 105, to a command decoder 115. The command decoder 115 receives the command signals and provides internal command signals to perform memory operations, for example, access operations such as a read operation to read data from the memory array 150 and a write operation to write data to the memory array 150. The internal command signals may include, for example, command signals provided to the row decoder 140 to perform access operations.

When an activate command is received with a row address, and a read command is received with a column address, read data is read from a memory cell in the memory array 150 designated by these row address and column address. The read command is received by the command decoder 115, which provides internal commands so that the read data is output to outside from the data terminals DQ via read/write amplifiers 155 and the input/output circuit 160. The read data is provided at a time defined by read latency information RI, that may be programmed in the semiconductor device, for example, in a mode register. The read latency information RL may be defined in terms of clock cycles of the CKt clock signal. For example, the read latency information RL may be a number of clock cycles of the CKt signal after the read command is received by the semiconductor device 100 when the associated read data is provided at the data terminals DQ.

When an activate command is received with a row address, and a write command is received with a column address, along with write data provided to the data terminals DQ, the write data is written to a memory cell in the memory array 150 designated by these row address and column address. The write command is received by the command decoder 115, which provides internal commands so that the write data is received by data receivers in the input/output circuit 160, and supplied via the input/output circuit 160 and the read/write amplifiers 155 to the memory array 150

The external terminals of the semiconductor device 100 further include clock terminals that are supplied with external clock signals and complementary external clock signals. The external clock signals CKt and CKc may be supplied to a clock input circuit 120. The clock input circuit 120 may receive the external clock signals to generate internal clock ICK that are supplied to internal clock circuits 130.

The internal clock circuits 130 includes circuits that provide various phase and frequency controlled internal clocks based on the received internal clock ICK. For example, the internal clock circuits 130 may include a clock path that receives the ICK clock and provides multiphase clocks DllClk. The multiphase clocks DllClk may be provided to the input/output circuit 160 for controlling an output timing of read data and the input timing of write data.

Power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. A power supply potential VDDQ is also provided to the power supply terminals. The power supply potential VDDQ is supplied to the input/output circuit 160 together with the power supply potential VSS. The power supply potential VDDQ may be the same potential as the power supply potential VDD, but is a dedicated power supply potential used for the input/output circuit 160 so that power supply noise generated by the input/output circuit 160 does not propagate to the other circuit blocks.

Figure 2:
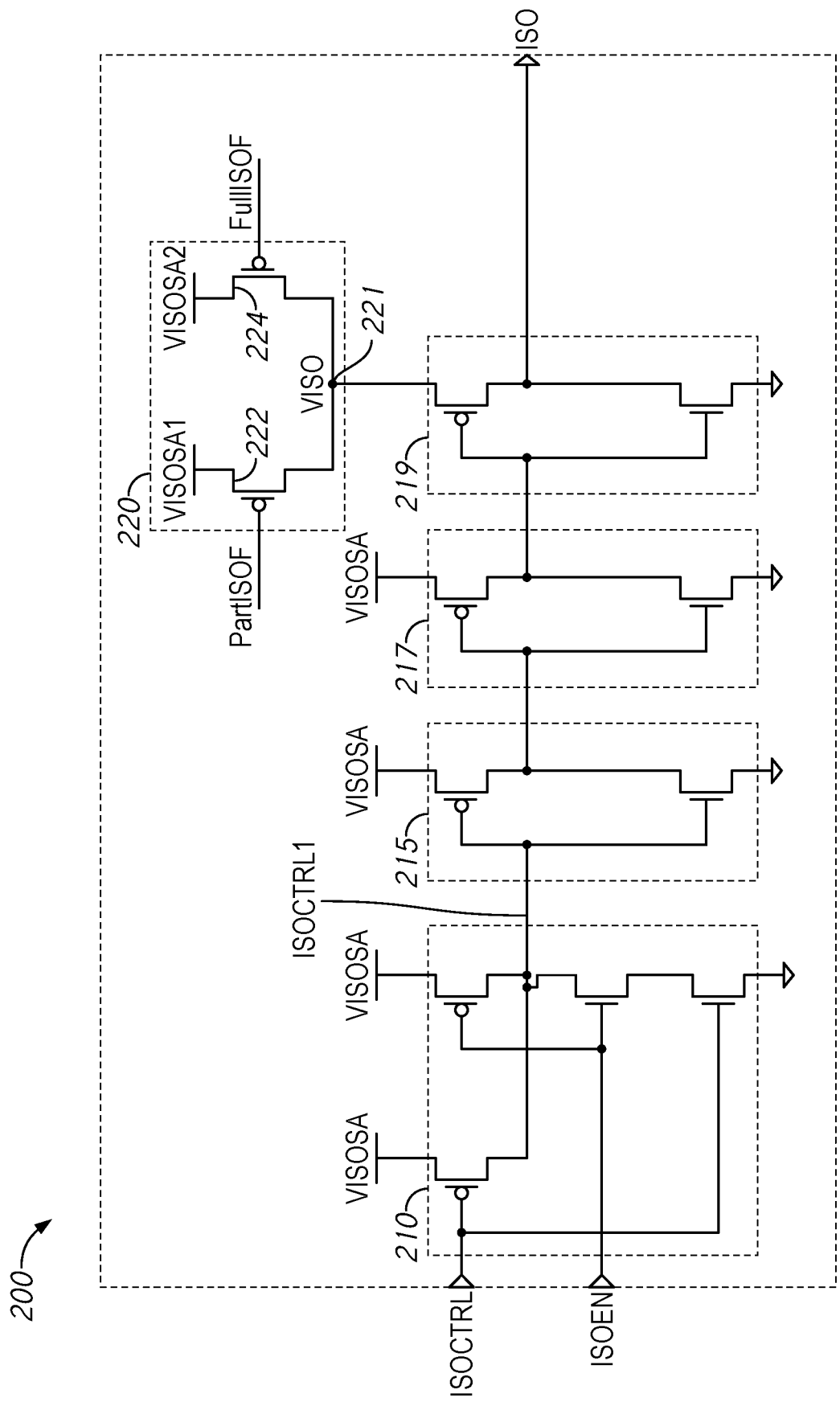
FIG. 2 is a schematic diagram of a control signal driver circuit according to an embodiment of the disclosure.

FIG. 2 is a schematic diagram of a control signal driver circuit 200 according to an embodiment of the disclosure. The control signal driver circuit 200 may be included in the row decoder 140 of FIG. 1 to provide, for example, the control signal ISO.

The control signal driver circuit 200 includes a control logic circuit 210 and inverter circuits 215, 217, and 219 coupled in series. The control logic circuit 210 receives a control signal ISOCTRL and an enable signal ISOEN. When the enable signal ISOEN is inactive, (e.g., inactive low logic level), the control logic circuit 210 provides an intermediate control signal ISOCTRL1 having a high logic level regardless of the logic level of the control signal ISOCTRL. However, when the ISOEN signal is active (e.g., active high logic level), the control logic circuit 210 provides the intermediate control signal ISOCTRL1 having a logic level complementary to the logic level of the control signal ISOCTRL. The intermediate control signal ISOCTRL1 is provided through the inverter circuits 215, 217, and 219 to be output by the control signal driver circuit 200 as a control signal ISO. The control signal ISO provided by the control signal driver circuit 200 has a same logic level as the control signal ISOCTRL when the enable signal ISOEN is active, and has a low logic level when the enable signal ISOEN is inactive.

The control signal driver circuit 200 further includes a voltage control circuit 220 that provides a high logic level voltage VISO to one or more of the inverter circuits 215, 217, and 219. For example, in some embodiments of the disclosure, the voltage control circuit 220 provides the high logic level voltage VISO at a node 221 to at least the inverter circuit 219. The inverter circuit 219 provides the control signal ISO. As a result, the control signal ISO has the high logic level voltage VISO when the control signal ISO is active (e.g., active high logic level). In some embodiments of the disclosure, the voltage control circuit 220 also provides the high logic level voltage VISO to the inverter circuit 215 and/or the inverter circuit 217.

The voltage control circuit 220 includes a voltage switch 222 that provides a voltage VISOSA1 to the node 221 when activated by an active control signal PartISOF (e.g., active low logic level). As a result, the voltage control circuit 220 provides the voltage VISOSA1 as the high logic level voltage VISO. The voltage control circuit 220 further includes a voltage switch 224 that provides a voltage VISOSA2 to the node 221 when activated by an active control signal FullISOF (e.g., active low logic level). As a result, the voltage control circuit 220 provides the voltage VISOSA2 as the high logic level voltage VISO. The voltage VISOSA1 and VISOSA2 are different. In some embodiments of the disclosure, the voltage VISOSA1 is less than the voltage VISOSA2. For example, the voltage VISOSA1 may be 1.2V and the voltage VISOSA2 may be 1.5V in some embodiments. In some embodiments of the disclosure, the voltage control circuit 220 is coupled to the inverter circuits 215, 217, and/or the control logic circuit 210 to provide the high logic level voltage VISO, instead of the inverter circuits 215 and 217, and the control logic circuit 210 being provided a voltage VISOSA, as shown in FIG. 2. For example, the node 221 may be coupled to and shared by the inverter circuits 215 and 217, and/or the control logic circuit 210 to provide the high logic level voltage VISO. In some embodiments of the disclosure, one or more additional voltage control circuits may be included in the control signal driver circuit 200 to provide a high logic level voltage VISO to the inverter circuits 215 and 217, and/or the control logic circuit 210. For example, an additional voltage control circuit may be included in the control signal driver circuit 200 and shared by the inverter circuits 215 and 217, and/or the control logic circuit 210. In another example, a separate voltage control circuit is included in the control signal driver circuit 200 for each inverter circuit 215 and 217, and/or the control logic circuit 210. In some embodiments of the disclosure, the voltage control circuit 220 (and any additional voltage control circuits) may be used to provide the high logic level voltage VISO for one or more other circuits that would otherwise be provided the voltage VISOSA.

The control signal ISOCTRL and enable signal ISOEN, and the control signals PartISOF and FullISOF may be provided by control circuits that may be included, for example, in a row decoder (e.g., row decoder 140) or a command decoder (e.g., command decoder 115). The control circuits provide various internal signals for performing memory operations, such as an access operation responsive to an access command.

In operation, when the control signal driver circuit 200 is enabled by an active enable signal ISOEN, the control signal ISOCTRL is driven through the control logic circuit 210 and through inverter circuit 215-219 to be provided as the control signal ISO. As previously described, the inverter circuit 219 provides an active control signal ISO having the high logic level voltage VISO, which is provided to the inverter circuit 219 by the voltage control circuit 220. The high logic level voltage VISO provided by the voltage control circuit 220 may be the voltage VISOSA1 (provided by the voltage switch 222) or the voltage VISOSA2 (provided by the voltage switch 224). For example, during an access operation, the active control signal ISO may have a high logic level voltage VISO that is equal to the voltage VISOSA1 during a portion of the access operation and then have a high logic level voltage VISO that is equal to the (higher) voltage VISOSA2 for another portion of the access operation.

FIGS. 3A and 3B are diagrams of various voltages and signals during operation of a control signal driver circuit according to an embodiment of the disclosure. In some embodiments, the various voltages and signals shown in FIGS. 3A and 3B may be during operation of the control signal driver circuit 200. FIGS. 3A and 3B will be described with reference to the control signal driver circuit 200. However, the various voltages and signals of FIGS. 3A and 3B are not limited to operation of the control signal driver circuit 200, and the control signal driver circuit 200 is not limited to the operation of FIGS. 3A and 3B.

FIG. 3A is a signal diagram of a high logic level voltage VISO provided by the voltage control circuit 220 and control signals ISOCTRL, PartISOF, and FullISOF provided to an enabled control signal driver circuit 200 (e.g., enable signal ISOEN is active) according to an embodiment of the disclosure. FIG. 3B is a signal diagram of a control signal ISO provided by the enabled control signal driver circuit 200 according to an embodiment of the disclosure.

Prior to time T0, the voltage control circuit 220 provides a high logic level voltage VISO that is equal to a voltage VISOSA1. For example, the voltage switch 222 is activated by an active control signal PartISOF to provide the voltage VISOSA1 to the node 221. At around time T0, the control signal ISOCTRL becomes active. The active control signal ISOCTRL is driven through control logic circuit 210 and inverter circuits 215-219 to provide an active control signal ISO having the high logic level voltage of the VISOSA1 voltage following time T0, as shown in FIG. 3B. As the control signal ISOCTRL remains active following time T0, the control signal ISO also remains active and continues to have the high logic level voltage of the VISOSA1 voltage. However, while the control signal ISOCTRL continues to be active, at around time T1, the voltage switch 222 is deactivated by an inactive control signal PartISOF and the voltage switch 224 is activated by an active control signal FullISOF to provide the voltage VISOSA2 to the node 221. As a result, the high logic level voltage VISO provided by the voltage control circuit 220 changes from the voltage VISOSA1 to the higher voltage VISOSA2. In some embodiments of the disclosure, the voltage VIOSA1 may be 1.2V and the voltage VIOSA2 may be 1.5V.

The change in the high logic level voltage VISO from the voltage VISOSA1 to the higher voltage VISOSA2 following time T1 causes the voltage of the active control signal ISO driven by the inverter circuit 219 to change from the high logic level voltage of the VISOSA1 voltage to the VISOSA2 voltage.

At a later time, the high logic level voltage VISO may be changed from the voltage VISOSA2 to the lower voltage VISOSA1 by deactivating the voltage switch 224 with an inactive control signal FullISOF and activating the voltage switch 222 with an active control signal PartISOF. As a result, the voltage of the active control signal ISO changes from the high logic level voltage of VISOSA2 to the lower VISOSA1 voltage.

As will be described in more detail below, in some embodiments of the disclosure, an active control signal ISO may be provided having a relatively lower voltage high logic level voltage for a portion of an access operation (e.g., during a sensing phase of a sense amplifier) and then provided having a relatively higher voltage high logic level voltage for another portion of the access operation (e.g., following activation of the sense amplifier). The active control signal ISO may be again provided having the relatively lower voltage high logic level for yet another portion of the access operation. For example, the active control signal ISO may switch from the relatively higher voltage high logic level to the relatively lower voltage high logic level before or during precharge of the sense amplifier. In another example, the high logic level VISO may switch from the relatively higher voltage high logic level to the relatively lower voltage high logic level when the control signal ISO is inactive and has an inactive low voltage. During the time the control signal ISO is inactive, the high logic level voltage VISO is not needed and can be switched from VISOSA2 to VISOSA1 without affecting the inactive low voltage of the control signal ISO, for example. Providing the active control signal ISO with the relatively lower high logic level voltage for portions of the access operation may improve performance by reducing coupling noise during transition of the control signal ISO from an inactive low voltage level to an active high voltage level.

Figures 4, 5:
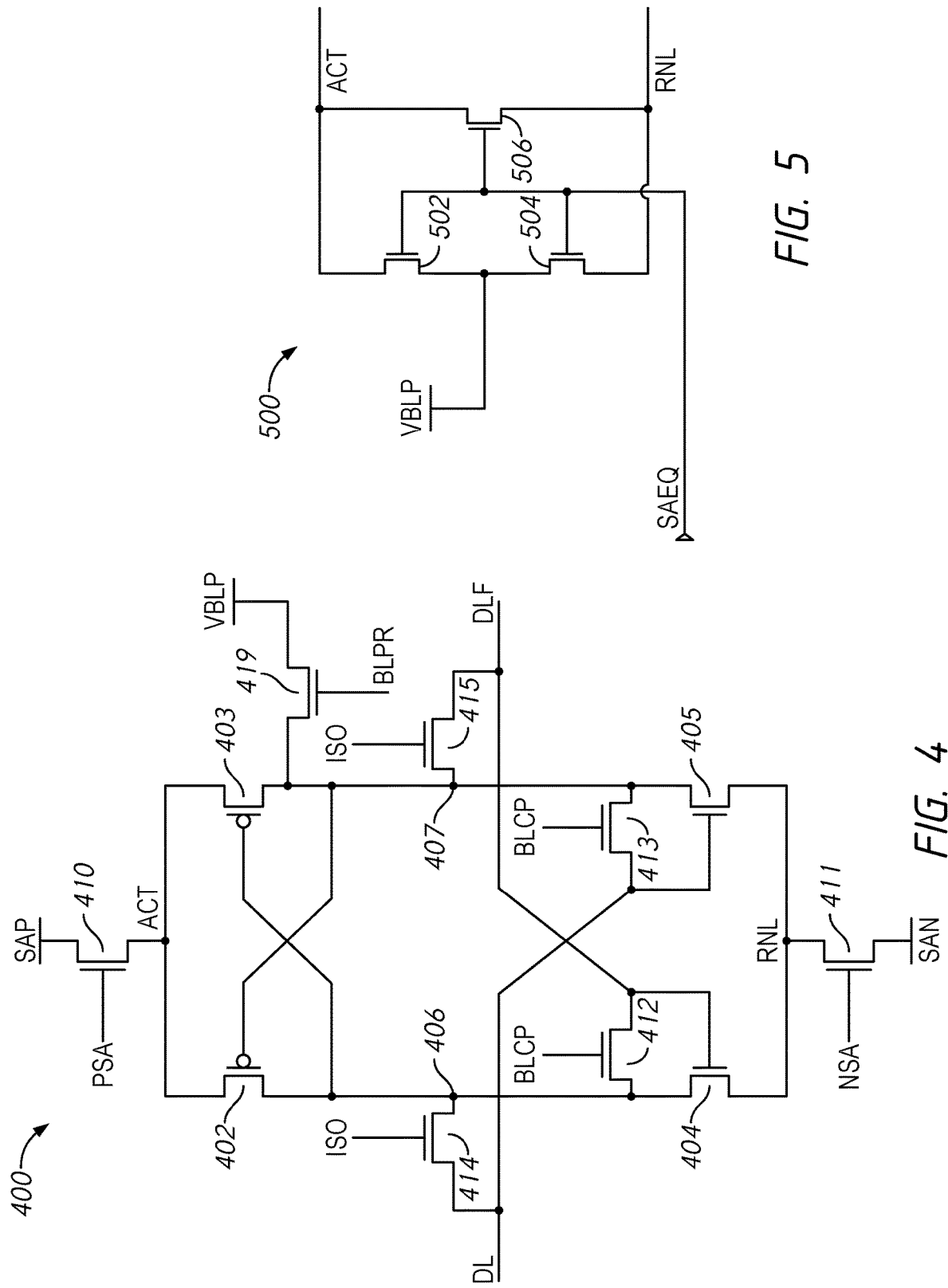
FIG. 4 is a schematic diagram of a sense amplifier according to an embodiment of the disclosure.
FIG. 5 is a schematic diagram of a precharge circuit according to an embodiment of the disclosure.

FIG. 4 is a schematic diagram of a sense amplifier 400 according to an embodiment of the disclosure. The sense amplifier 400 may be included in the sense amplifier SAMP of FIG. 1 in some embodiments of the disclosure. The sense amplifier 400 of FIG. 4 may be referenced as a threshold voltage compensated sense amplifier.

The sense amplifier 400 includes pull-up circuits 402 and 403, and pull-down circuits 404 and 405 coupled to sense nodes 406 and 407, all respectively. The pull-up circuits 402 and 403 are provided a pull-up voltage SAP at voltage node ACT when a pull-up voltage switch 410 is activated by an active control signal PSA (e.g., active high logic level). The pull-down circuits 404 and 405 are provided a pull-down voltage SAN at voltage node RNL when a pull-down voltage switch 411 is activated by an active control signal NSA (e.g., active high logic level).

The sense amplifier 400 further includes compensation switches 412 and 413 that are activated by an active compensation control signal BLCP (e.g., active high logic level) during a compensation phase of an access operation. Isolation switches 414 and 415 included in the sense amplifier 400 are coupled to sense nodes 406 and 407, and further coupled to sense lines DL and DLF, all respectively. When activated by an active control signal ISO (e.g., active high logic level), the isolation switches 414 and 415 provide conductive paths between the sense nodes 406 and 407 and the respective sense line DL and DLF. A precharge switch 419 provides a precharge voltage VBLP to one or both of the sense nodes 406 and 407 when activated by an active sense line precharge control signal BLPR (e.g., active high logic level).

FIG. 5 is a schematic diagram of a precharge circuit 500 according to an embodiment of the disclosure. The precharge circuit 500 may be included in the memory cell array 145 of FIG. 1 in some embodiments of the disclosure.

The precharge circuit 500 is activated to precharge one or more sense amplifiers during a precharge operation to prepare the one or more sense amplifiers for an access operation. The precharge circuit 500 includes precharge voltage circuits 502 and 504, and an equalization circuit 506. The precharge voltage circuits 502 and 504, and the equalization circuit 506 are activated by an active precharge control signal SAEQ (e.g., active high logic level). When activated, the precharge voltage circuit 502 and 504 provide a precharge voltage VBLP to the voltage nodes ACT and RNL of one or more sense amplifiers. The equalization circuit 506 provides a conductive path when activated to equalize voltages of the voltage nodes ACT and RNL.

Figure 6A:
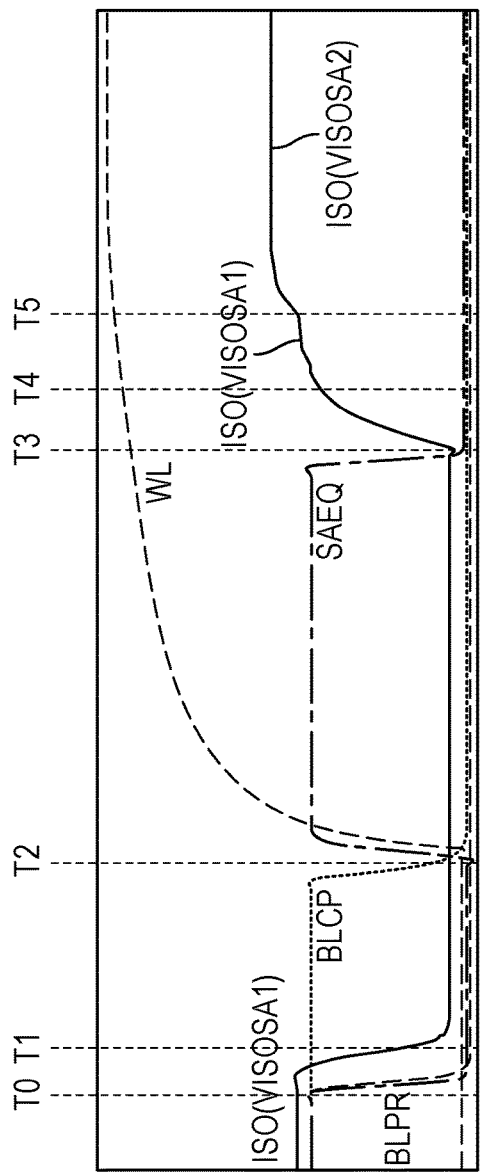
FIGS. 6A and 6B are diagrams of various voltages and signals during an access operation according to an embodiment of the disclosure.
Figure 6B:
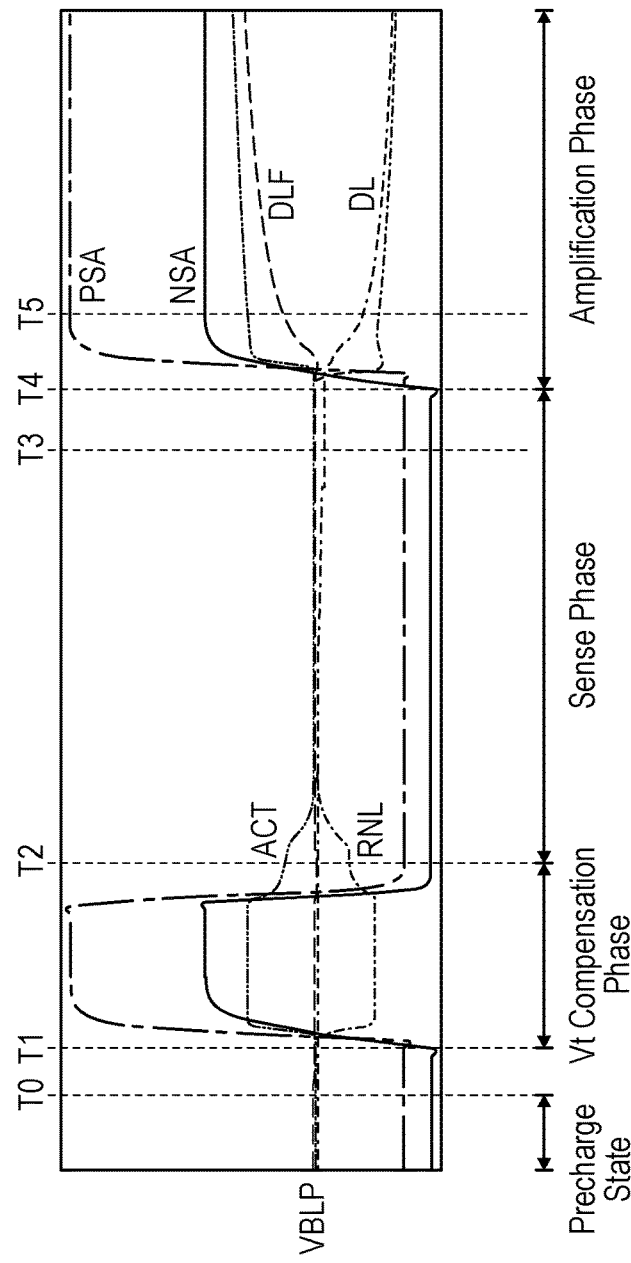

FIGS. 6A and 6B are diagrams of various voltages and signals during an access operation according to an embodiment of the disclosure. In some embodiments, the various voltages and signals shown in FIGS. 6A and 6B may be during operation of the control signal driver circuit 200 of FIG. 2, the sense amplifier 400 of FIG. 4, and/or precharge circuit 500 of FIG. 5. FIGS. 6A and 6B will be described with reference to the control signal driver circuit 200, the sense amplifier 400, and the precharge circuit 500. However, the various voltages and signals of FIGS. 6A and 6B are not limited to operation of the control signal driver circuit 200, the sense amplifier 400, and the precharge circuit 500. Moreover, the control signal driver circuit 200, the sense amplifier 400, and the precharge circuit 500 are not limited to the operation of FIGS. 6A and 6B.

Prior to time T0, circuits for an access operation are activated (e.g., in response to an activate command) and are placed in a precharge state. While in the precharge state, control signals PSA and NSA are inactive (e.g., inactive PSA at a reference voltage and inactive NSA at a negative voltage) so that the pull-up voltage SAP and the pull-down voltage SAN are not provided to the voltage nodes ACT and RNL through the pull-up voltage switch 410 and the pull-down voltage switch 411, all respectively. Also during the precharge state, the precharge control signal SAEQ, sense line precharge control signal BLPR, and the compensation control signal BLCP are active to activate precharge voltage circuits 502 and 504, and the equalization circuit 506 of the precharge circuit 500, activate the precharge switch 419, and also activate compensation switches 412 and 413 of the sense amplifier 400. Additionally during the precharge state, the control signal ISO is active to activate isolation switches 414 and 415. During the precharge state, the active control signal ISO may have a high logic level voltage VISO equal to the voltage VISOSA1. Alternatively, the active control signal ISO may have the high logic level VISO equal to the voltage VISOSA2 during the precharge state, and the high logic level voltage VISO may be switched from the relatively higher voltage high logic level to the relatively lower voltage high logic level at a later time during the access operation or during a subsequent (e.g., immediately following) access operation. In some embodiments of the disclosure, the high logic level voltage VISO may be switched from the relatively higher voltage high logic level to the relatively lower voltage high logic level during the time the control signal ISO is inactive and the high logic level voltage VISO is not needed, for example.

As a result of the inactive control signals PSA and NSA, along with the active control signals SAEQ, BLPR, BLCP, and ISO, the sense nodes 406 and 407, sense lines DL and DLF, and the voltage nodes ACT and RNL are at a precharge voltage VBLP and ready for a sense amplifier operation.

Following time T0 and before time T1 when a threshold voltage (Vt) compensation phase of the sense amplifier operation begins, the control signals SAEQ, BLPR, and ISO become inactive, while the compensation control signal BLCP remains active. With the control signals SAEQ, BLPR, and ISO inactive, the sense nodes 406 and 407 are isolated from the respective sense lines DL and DLF and are floating at the precharge voltage VBLP.

During the Vt compensation phase following time T1, a Vt difference between the pull-down circuits 404 and 405 is compensated by setting a compensation voltage on one of the sense nodes 406 and 407. Following time T1, with the compensation control signal BLCP active (so that compensation switches 412 and 413 active) and the sense nodes 406 and 407 floating at the precharge voltage VBLP, the pull-up voltage switch 410 and the pull-down voltage switch 411 are activated by active control signals PSA and NSA. The activated pull-up voltage switch 410 provides the pull-up voltage SAP to the voltage node ACT and the activated pull-down voltage switch 411 provides the pull-down voltage SAN to the voltage node RNL. As a result, a compensation voltage is developed between the sense nodes 406 and 407 to compensate for the Vt difference between the pull-down circuits 404 and 405.

Following the development of the compensation voltage and prior to time T2, the pull-up voltage switch 410 and pull-down voltage switch 411 are deactivated by the control signals PSA and NSA becoming inactive, and the compensation switches 412 and 413 are deactivated by the compensation control signal BLCP becoming inactive. As a result, the sense nodes 406 and 407 are again isolated and floating, but with the compensation voltage between the sense nodes.

Following time T2 when a sense phase of the sense amplifier operation begins, the precharge control signal SAEQ becomes active to activate precharge voltage circuits 502 and 504, and the equalization circuit 506 of the precharge circuit 500 to drive the voltage nodes ACT and RNL to the precharge voltage VBLP. Also following time T2, access line WL is activated to access a memory cell that provides a stored charge (that represents the data stored by the memory cell) to one of the sense lines DL or DLF to which the memory cell is coupled. The stored charge provided by the memory cell causes the voltage of the respective sense line to increase or decrease, which results in a voltage difference between the sense lines DL and DLF that will be sensed and amplified by the sense amplifier 400.

Prior to time T3, the precharge voltage circuits 502 and 504, and the equalization circuit 506 of the precharge circuit 500 are deactivated as the precharge control signal SAEQ becomes inactive. As a result, the voltage nodes ACT and RNL are floating at the precharge voltage VBLP. Additionally, prior to time T3 the high logic level VISO is ready to be provided at the relatively lower voltage high logic level (e.g., VISOSA1) in preparation for activation of the control signal ISO following time T3. For example, the high logic level voltage VISO may be switched from the relatively higher voltage high logic level to the relatively lower voltage high logic level prior to time T3, such as when the control signal ISO is inactive and the high logic level voltage VISO is not needed. An example of when the high logic level voltage VISO may be switched is during the Vt compensation phase (e.g., between times T1 and T2) when the control signal ISO is inactive.

Following time T3, the isolation switches 414 and 415 are activated by the control signal ISO becoming active. The activated isolation switches 414 and 415 provide the voltages of the sense lines DL and DLF to the respective sense nodes 406 and 407 to develop a voltage difference that is sensed by the sense amplifier 400. When the control signal ISO is activated following time T3, it is driven to a high logic level voltage of VISOSA1 to activate the isolation switches 414 and 415. The voltage level of the voltage VISOSA1 is sufficient to cause the isolation switches 414 and 415 to be conductive to fully provide the voltage of the sense lines to the respective sense node without any reduction in voltage (e.g., VISOSA1=1.2V in some embodiments of the disclosure).

Following time T4 when the amplification phase of the sense amplifier operation begins, the sense amplifier 400 is activated by activating the pull-up voltage switch 410 and the pull-down voltage switch 411 to provide the pull-up voltage SAP and the pull-down voltage SAN to the voltage nodes ACT and RNL, all respectively. The voltage difference between the sense nodes 406 and 407 is amplified by driving each of the sense nodes to opposite voltages. For example, the sense node having a lower voltage is driven to the pull-down voltage SAN and the sense node having a higher voltage is driven to the pull-up voltage SAP. With reference to the example of FIGS. 6A and 6B, the sense line DL has a relatively lower voltage than DLF causing the sense node 406 to have a lower relative voltage than the sense node 407. When the sense amplifier 400 is activated, the sense node 406 (corresponding to sense line DL) is driven by the pull-down circuit 404 to the pull-down voltage SAN and the sense node 407 (corresponding to the sense line DLF) is driven by the pull-up circuit 403 to the pull-up voltage SAP, as shown in FIG. 6B.

Also following time T4, the active control signal ISO reaches the high logic level voltage of VISOSA1. At around time T5 (e.g., after the sense nodes 406 and 407 are driven to opposite voltages) the high logic level voltage of the control signal ISO increases from the voltage VISOSA1 to the voltage VISOSA2. For example, prior to time T5, the voltage switch 222 is activated (e.g., by an active control signal PartISOF) to provide the voltage VISOSA1 to the node 221 as the high logic level voltage VISO. At around time T5, the voltage switch 222 is deactivated (e.g., the control signal PartISOF becomes inactive) and the voltage switch 224 is instead activated (e.g., by an active control signal FullISOF) to provide the voltage VISOSA2 to the node 221 as the high logic level voltage VISO. As a result, the active control signal ISO (high logic level) is driven by the inverter circuit 219 to have the high logic level voltage of VISOSA2.

The control signal ISO increases in voltage following activation of the sense amplifier 400. Increasing the high logic level voltage of the control signal ISO may improve write back of the data state to the accessed memory cell to restore the stored data. For example, the higher voltage of VISOSA2 may allow the full pull-up voltage SAP to be provided to one of the sense lines DL or DLF through the respective isolation switch 414 or 415.

Following time T5, the access line WL is deactivated to deactivate the memory cell and retain the stored data. Additionally, a precharge operation following the amplification phase may be performed to place the sense amplifier 400 and the sense lines DL and DLF into a precharge state in preparation for a subsequent access operation. The precharge state of the sense amplifier 400 and the sense lines DL and DLF was previously described with reference to the precharge state prior to time T0.

During the precharge operation, the sense lines DL and DLF, and the sense amplifier 400 are precharged to set the sense lines DL and DLF, sense nodes 406 and 407, and the voltage nodes ACT and RNL to the precharge voltage VBLP. The precharge voltage circuits 502 and 504, and the equalization circuit 506 of the precharge circuit 500 may be activated by an active control signal SAEQ to provide the precharge voltage VBLP to the voltage nodes ACT and RNL. The precharge switch 419, and compensation switches 412 and 413 are also activated by an active sense line precharge control signal BLPR and an active compensation control signal BLCP to provide the precharge voltage VBLP to the sense nodes 406 and 407.

Additionally, the isolation switches 414 and 415 are activated by an active control signal ISO to provide the precharge voltage VBLP to the sense lines DL and DLF. During the precharge operation, the control signal ISO may have the lower high logic level voltage of VISOSA1. For example, the voltage switch 224 is deactivated and the voltage switch 222 is activated to switch the high logic level voltage VISO provided by the voltage control circuit 220 from the higher voltage VISOSA2 that was used following time T5 to the lower voltage VISOSA1 that may be used during the precharge operation. As a result, the inverter circuit 219 provides the active control signal ISO having the high logic level voltage of VISOSA1.

In some embodiments of the disclosure, providing an active control signal ISO having two different high logic level may improve performance during a sense amplifier operation. For example, switching a high logic level voltage for an active control signal ISO to a lower high logic level voltage of VISOSA1 may reduce coupling noise when the control signal ISO becomes active, such as before the sense amplifier 400 is activated for the amplification phase of the sense amplifier operation (e.g., prior to time T4) as previously described. Having the active control signal ISO at a higher high logic level voltage VISOSA2 during at least a portion of the amplification phase of the sense amplifier operation, such as after the sense amplifier is activated and the sense lines driven to respective opposite voltages, maintains memory cell restore performance. The higher high logic level voltage of the active control signal ISO may allow for the full pull-up voltage SAP to be provided to one of the sense lines DL or DLF to restore the data state of the accessed memory cell.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   first and second sense lines, each sense line coupled to a respective set of memory cells;
   a sense amplifier including first and second sense nodes, and further including a first isolation switch and a second isolation switch, the first isolation switch coupled to the first sense node and the first sense line and configured to provide a conductive path between the first sense node and the first sense line when activated, the second isolation switch coupled to the second sense node and the second sense line and configured to provide a conductive path between the second sense node and the second sense line when activated; and
   a control signal driver circuit configured to receive an input control signal and provide an output control signal responsive to the input control signal, the output control signal provided to the first and second isolation switches, the control signal driver circuit further configured to provide the output control signal having a low logic level voltage, and further configured to provide the output control signal having a first high logic level voltage for a first portion of a sense amplifier operation, and provide the active output control signal having a second high logic level voltage for a second portion of the sense amplifier operation, the second high logic level voltage greater than the first high logic level voltage.

2. An apparatus, comprising:
   first and second sense lines, each sense line coupled to a respective set of memory cells;
   a sense amplifier including first and second sense nodes, and further including a first isolation switch and a second isolation switch, the first isolation switch coupled to the first sense node and the first sense line and configured to provide a conductive path between the first sense node and the first sense line when activated, the second isolation switch coupled to the second sense node and the second sense line and configured to provide a conductive path between the second sense node and the second sense line when activated;
   a control signal driver circuit configured to receive an input control signal and provide an output control signal responsive to the input control signal, the output control signal provided to the first and second isolation switches, the control signal driver circuit further configured to provide the output control signal having a first high logic level voltage for a first portion of a sense amplifier operation and a second high logic signal voltage for a second portion of the sense amplifier operation, the second high logic level voltage greater than the first high logic level voltage;
   a control logic circuit configured to receive the input control signal and an enable signal, the control logic circuit further configured to provide an intermediate control signal responsive to the input control signal when enabled by an active enable signal;
   a plurality of inverter circuits coupled in series, a first inverter circuit of the plurality of inverter circuits configured to receive the intermediate control signal and a last inverter circuit of the plurality of inverter circuits configured to provide the output control signal; and
   a voltage control circuit coupled to at least one of the plurality of inverter circuits and configured to provide a high logic level voltage, the voltage control circuit further configured to provide the high logic level voltage at the first high logic level voltage for the first portion of the sense amplifier operation and to provide the high logic level voltage at the second high logic level voltage for the second portion of the sense amplifier operation.

3. The apparatus of claim 2 wherein the voltage control circuit comprises:
   a node at which the high logic level voltage is provided;
   a first voltage switch coupled to the node and configured to provide the first high logic level voltage to the node when activated; and
   a second voltage switch coupled to the node and configured to provide the second high logic level voltage to the node when activated.

4. The apparatus of claim 3 wherein the first voltage switch is configured to be activated and the second voltage switch is configured to be deactivated during the first portion of the sense amplifier operation and wherein the first voltage switch is configured to be deactivated and the second voltage switch is configured to be activated during the second portion of the sense amplifier operation.

5. The apparatus of claim 2 wherein the voltage control circuit is coupled to at least the last inverter circuit of the plurality of inverter circuits.

6. The apparatus of claim 1, further comprising a precharge circuit coupled to the sense amplifier and configured to precharge voltage nodes of the sense amplifier to a precharge voltage.

7. The apparatus of claim 1 wherein the sense amplifier is a threshold voltage compensated sense amplifier.

8. An apparatus, comprising:
   a first sense line and a second sense line;
   a sense amplifier including a first isolation switch coupled to a first sense node and the first sense line, and including a second isolation switch coupled to a second sense node and the second sense line; and a control signal driver configured to provide a control signal to the first and second isolation switches of the sense amplifier, the control signal driver configured to provide the control signal to deactivate the first and second isolation switches having a low logic level voltage and further configured to provide the control signal to activate the first and second isolation switches having a first high logic level voltage or a second high logic level voltage, the second high logic level voltage greater than the first high logic level voltage.

9. The apparatus of claim 8 wherein the control signal driver is further configured to transition the control signal from the low logic level voltage to the first high logic level voltage to activate the first and second isolation switches, and to increase the control signal from the first high logic level voltage to the second high logic level voltage thereafter.

10. The apparatus of claim 9 wherein the sense amplifier is configured to be activated after the first and second isolation switches and before the control signal increases from the first high logic level voltage to the second high logic level voltage.

11. The apparatus of claim 9 wherein the sense amplifier is further configured to be precharged and wherein the control signal driver is further configured to decrease a high logic level voltage for the control signal from the second high logic level voltage to the first high logic level voltage when the sense amplifier is precharged.

12. The apparatus of claim 9 wherein the sense amplifier is configured to be threshold voltage compensated and wherein the control signal driver is further configured to decrease a high logic level voltage for the control signal from the second high logic level voltage to the first high logic level voltage during threshold voltage compensation of the sense amplifier.

* * * * *